United States Patent [19]

Andros et al.

[11] Patent Number: 5,367,435
[45] Date of Patent: Nov. 22, 1994

[54] ELECTRONIC PACKAGE STRUCTURE AND METHOD OF MAKING SAME

[75] Inventors: Frank E. Andros, Binghamton; Christopher G. Angulas, Owego; Joseph M. Milewski, Binghamton, all of N.Y.

[73] Assignee: International Business Machines Corporation, Armonk, N.Y.

[21] Appl. No.: 153,734

[22] Filed: Nov. 16, 1993

[51] Int. Cl.[5] .............................................. H05K 1/00
[52] U.S. Cl. ..................................... 361/749; 361/743; 361/784; 361/792; 174/263; 257/686; 257/779
[58] Field of Search ............... 361/743, 748, 749, 760, 361/761, 767, 783, 784, 790, 792, 803, 810, 807; 174/138 G, 255, 263; 257/686, 700, 779

[56] References Cited

U.S. PATENT DOCUMENTS

| | | | |
|---|---|---|---|
| 3,795,047 | 3/1974 | Abolafia et al. | 29/625 |
| 4,413,308 | 11/1983 | Brown | 361/398 |
| 4,435,740 | 3/1984 | Huckabee et al. | 361/398 |
| 5,045,975 | 9/1991 | Cray et al. | 361/412 |
| 5,054,192 | 10/1991 | Cray et al. | 29/835 |
| 5,057,969 | 10/1991 | Ameen et al. | 361/386 |
| 5,115,964 | 5/1992 | Ameen et al. | 228/180.2 |
| 5,127,570 | 7/1992 | Steitz et al. | 228/103 |
| 5,133,495 | 7/1992 | Angulas et al. | 228/180.1 |
| 5,135,155 | 8/1992 | Kang et al. | 228/179 |
| 5,159,535 | 10/1992 | Desai et al. | 361/398 |
| 5,164,336 | 11/1992 | Ohno et al. | 437/220 |
| 5,195,237 | 3/1993 | Cray et al. | 29/838 |
| 5,203,075 | 4/1993 | Angulas et al. | 29/830 |
| 5,222,014 | 6/1993 | Lin | 361/414 |

FOREIGN PATENT DOCUMENTS

| | | | |
|---|---|---|---|
| 0152189 | 1/1985 | European Pat. Off. | H01L 21/60 |
| 52-69564 | 6/1977 | Japan | H01L 23/48 |
| 53-66166 | 6/1978 | Japan | H01L 23/54 |

OTHER PUBLICATIONS

Surface Mount Technology, "Plastic Encapsulated Tape Automated Bonded Package", Feb. 1985, pp. 158–159.

*Primary Examiner*—Leo P. Picard
*Assistant Examiner*—Young Whang
*Attorney, Agent, or Firm*—Lawrence R. Fraley

[57] ABSTRACT

An electronic package and method of making same wherein a flexible circuitized substrate is used to interconnect contact sites on a semiconductor device (chip) to respective conductors on a circuitized substrate (PCB). Significantly, the flexible substrate is coupled to the PCB using solder elements which are applied to the flexible substrate prior to semiconductor device coupling to others of the flexible substrates' conductive elements. These other conductive elements are then connected to the devices' contact sites using thermocompression bonding, the bonding occurring through an aperture in the flexible substrate.

10 Claims, 3 Drawing Sheets

ELECTRONIC PACKAGE STRUCTURE AND METHOD OF MAKING SAME

TECHNICAL FIELD

This invention relates to electronic packaging structures (assemblies) and particularly to such structures which utilize thin film flexible circuitized substrates as part thereof. Even more particularly, the invention relates to such packaging structures which may be utilized in the information handling systems (computer) field.

CROSS REFERENCE TO COPENDING APPLICATIONS

In Ser. No. 07/903,838, filed Jun. 24, 1992 now U.S. Pat. No. 5,343,366 and entitled "Packages For Stacked Integrated Circuit Chip Cubes", there is defined an integrated circuit (IC) package wherein two flexible circuitized substrates each include leads which are bonded to a semiconductor chip through apertures in the substrate, such bonding made possible using thermocompression bonding, among other techniques. The leads may then be encapsulated in polymer, e.g., epoxy. Both flexible substrates are coupled electrically by a third, common flexible substrate, which couples the chips to another substrate. An elastomer is used to press the parallel chips against a heat sink, for heat dissipation purposes.

BACKGROUND OF THE INVENTION

Electronic packaging structures of the type described above are known in the art including, for example, those shown and described in U.S. Pat. Nos. 4,849,856 (Funari et al), 4,914,551 (Anschel et al), 4,962,416 (Jones et al) and 4,965,700 (McBride). See also U.S. Pat. Nos. 5,057,969 (Ameen et al), 5,115,964 (Ameen et al), 5,133,495 (Angulas et al) and 5,203,075 (Angulas et al) for related structures. Such packaging structures, as defined in these patents, typically utilize at least one thin film, flexible circuitized substrate as part thereof. Typically, such circuitized substrates include a thin dielectric (e.g., polyimide) layer having at least one circuit layer (e.g., chrome-copper-chrome) thereon. Such thin film, flexible circuitized substrates may be positioned on and electrically coupled to another circuitized substrate (e.g., printed circuit board) to thereby electrically couple a semiconductor device (chip), which is connected to respective portions of the thin film, circuitized substrate's circuitry, to corresponding circuitry on the additional substrate. The aforementioned U.S. Pat. Nos. 4,849,856, 4914,551, 4,962,416 and 5,057,969 illustrate representative examples of such packaging structures which utilize this means of connection.

Thin film, flexible circuitized substrates as produced today possess several distinct advantages (e.g., high density, flexibility, relative ease of manufacture, etc.) desired in the information handling systems field.

As understood from the following, the invention is able to readily utilize such flexible circuitized substrates in combination with precision soldering techniques to produce a resulting electronic package structure of relatively high density. Such soldering techniques have been developed and utilized with much success by the assignee of the present invention to thereby provide resulting products at relatively low cost. Examples of such precision solder processes are defined in detail in the aforementioned U.S. Pat. Nos. 5,133,495 and 5,203,075. Both of these patents are thus incorporated herein by reference, as are the others cited above.

As defined in U.S. Pat. Nos. 5,133,495 and 5,203,075, minute solder elements (e.g., balls) are precisely positioned at locations on circuitized substrates to interconnect these substrates in a sound and effective manner.

As understood from the following, the invention is able to combine the above and similar soldering techniques with the utilization of flexible circuitized substrates to the extent that, uniquely, such solder elements can be precisely positioned immediately beneath the semiconductor device (chip) which forms part of the final package structure, while also providing effective means for electrically coupling conductive elements which form part of the flexible substrate to this device. The invention combines these advantageous teachings with a conventional, somewhat harsher procedure (thermal compression bonding) to thus also benefit from the known advantages of said procedure (e.g., reduced cost).

It is believed that an electronic packaging structure possessing the above advantageous features and others readily discernible from the teachings herein, and a method for making same, would constitute significant advancements in the art.

DISCLOSURE OF THE INVENTION

It is, therefore, a primary object of the invention to enhance the art of electronic packaging by providing a package and method of making same possessing the several advantageous features defined herein and discernible from the description provided herewith.

In accordance with one aspect of the invention, there is provided an electronic package which comprises a first circuitized substrate including a surface having a first plurality of electrical conductors thereon, a second circuitized substrate electrically coupled to the first circuitized substrate and including a surface having a first plurality of electrical conductive elements thereon, the second circuitized substrate being substantially flexible in nature and including at least one aperture therein, and a semiconductor device having a plurality of contact sites thereon and electrically coupled to the second flexible circuitized substrate along one side of the second substrate. Selected ones of the first plurality of electrical conductive elements of the second, flexible circuitized substrate are electrically coupled to respective, selected ones of the contact sites of the semiconductor device through the aperture, while selected ones of the electrical conductive elements are soldered to respective ones of the electrical conductors on the first circuitized substrate, including along a second side of the second substrate immediately opposite the semiconductor device.

In accordance with another aspect of the invention, there is provided a method of making an electronic package which comprises the steps of providing a first circuitized substrate having a plurality of electrical conductors therein, providing a second circuitized substrate including a surface having a first plurality of electrical conductive elements thereon and at least one aperture therein, affixing a plurality of solder elements onto respective ones of the first plurality of electrical conductive elements of the second circuitized substrate, providing a semiconductor device having a plurality of contact sites thereon, bonding selected ones of said first plurality of electrical conductive elements to respective ones of the contact sites of the semiconductor device through the aperture within the second circuitized substrate, and thereafter bonding the plurality of solder elements on the respective ones of the first plurality of electrical conductive elements to respective ones of the electrical conductors of the first circuitized substrate.

BEST MODE FOR CARRYING OUT THE INVENTION

For a better understanding of the present invention together with other and further objects, advantages and capabilities thereof, reference is made to the following disclosure and appended claims in connection with the above-described drawings.

Figure 1:
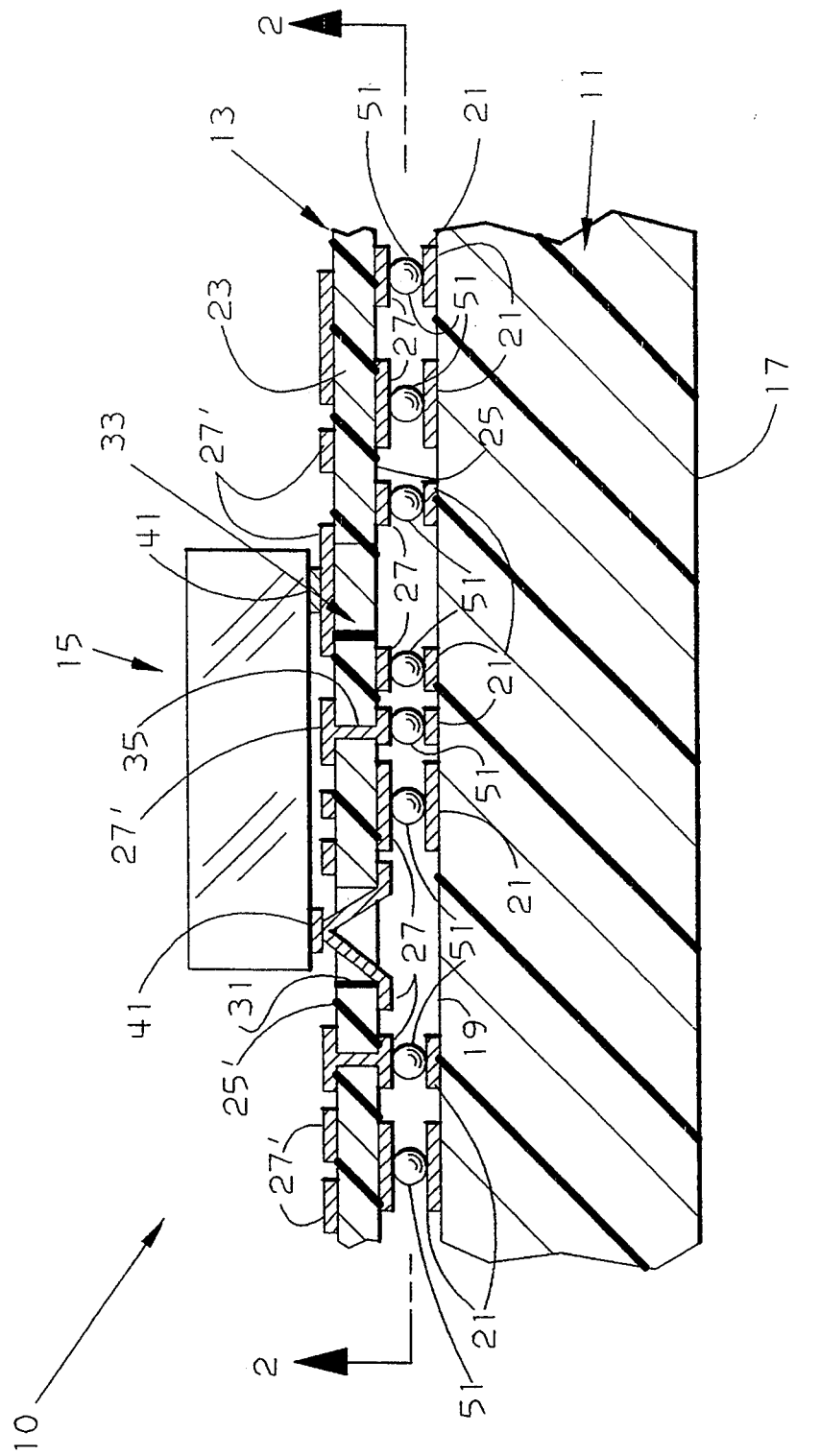
FIG. 1 is an elevational view, partly in section and on a much enlarged scale, of an electronic package structure in accordance with one embodiment of the invention.
Figure 2:
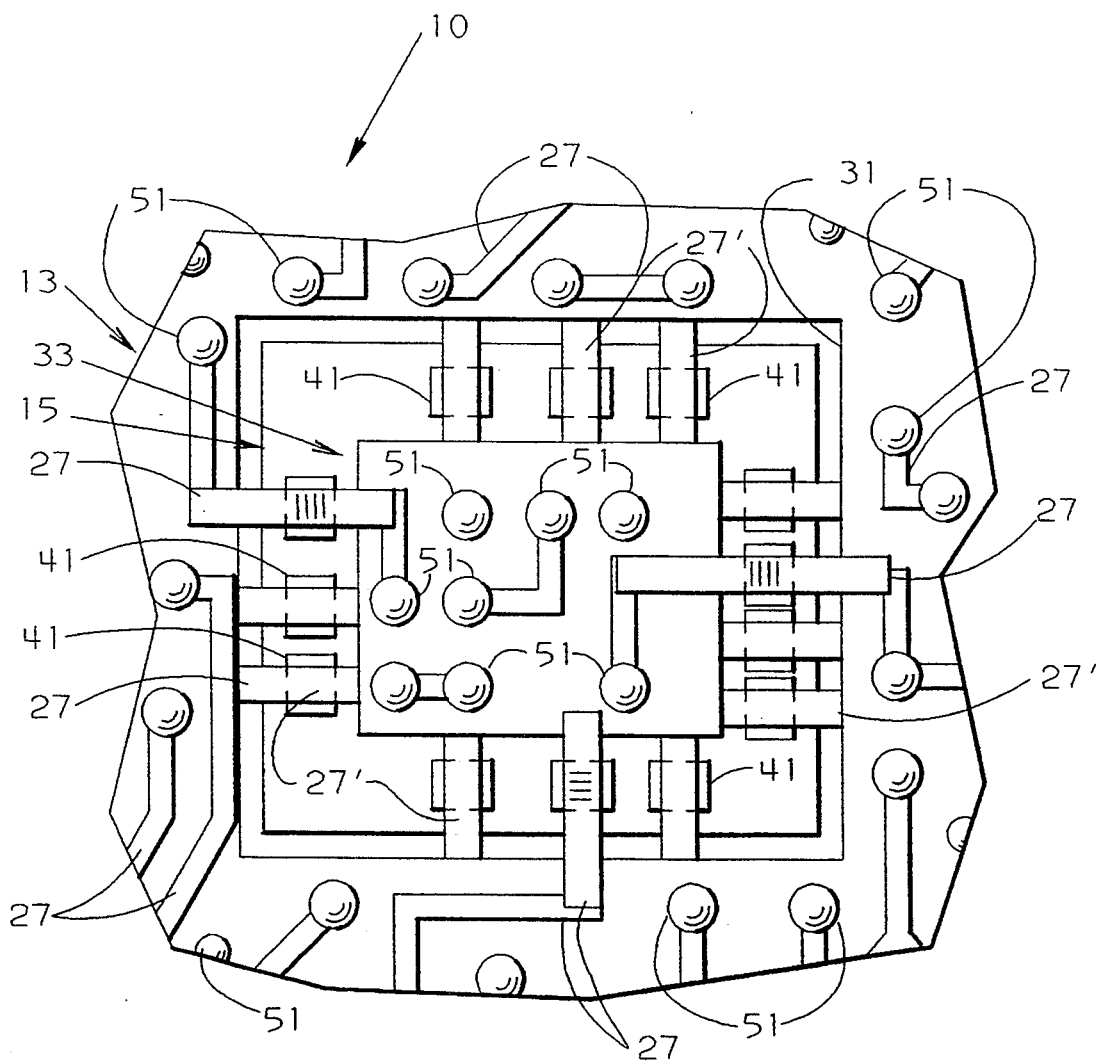
FIG. 2 is a partial plan view of the invention as taken along the line 2—2 in FIG. 1.

In FIGS. 1 and 2, there is shown all electronic package 10 in accordance with one embodiment of the invention. Package 10 comprises a first circuitized substrate 11, a second circuitized substrate 13 and a semiconductor device (chip) 15.

Substrate 11 is preferably a printed circuit board (PCB) which, as is known, includes a dielectric material 17 with one or more conductive planes located therein and/or thereon. Such conductive planes typically provide signal, power and/or ground capabilities for the PCB, as is well known in the art. PCBs may include several such conductive planes spacedly positioned within the dielectric 17, as is also well known. In the embodiment of FIG. 1, substrate 17 includes at least one upper surface 19 having thereon a plurality of electrical conductors 21, in turn may provide signal capabilities for substrate 11 and thus package 10. Each of these conductors 21 is preferably of copper material as is known in the art. Conductors 21 may comprise flat pads or the like as is known or comprise circuit lines as is also known. Such conductors may also be electrically coupled (e.g., using plated through holes, not shown) to selected internal conductive planes (not shown), as is also known in the art.

In one example, a substrate 11 having a thickness of about 0.060 inch and a total of four internal conductive planes (in addition to the illustrated external plane) was utilized.

Second circuitized substrate 13 is substantially flexible and includes at least one dielectric layer 23 having at least one side (the lower side in FIG. 1) including a surface 25 having several electrical conducting elements 27 thereon. Substrate 13 is electrically coupled to substrate 11 in the manner defined below, such that selected ones of the conductive elements 27 are electrically connected to respective, selected ones of the electrical conductors 21. As defined below, solder is the chosen means to accomplish these connections.

Substrate 13 is preferably comprised of a thin (e.g., 0.002 inch thick) polyimide dielectric layer (23) and the illustrated lower layer of conductive elements 27 on surface 25 are preferably of copper. Use of polyimide and copper conductive elements for a flexible circuitized substrate are known in the art and further description is not believed necessary. In the embodiment depicted in FIG. 1, each of the conductive elements 27 may comprise a metallic pad, similar to conductors 21, as well as a circuit line or the like. Additionally, and significantly, conductive elements designed to bridge respective apertures (described below) in substrate 13 are preferably copper leads which project across these apertures and are of substantially elongated configuration (FIG. 2).

As mentioned, substrate 13 includes at least one aperture 31 therein which, as shown in FIG. 2, is of substantially continuous shape so as to substantially surround a segmented portion 33 of substrate 13. This is not meant to limit the invention, however, in that individual apertures may be spacedly located within the substrates' polyimide layer in accordance with a predetermined pattern, each of the selected bridging leads thus bridging a respective one of such apertures. In the event a continuous surrounding aperture 31 is used, the respective bridging leads 27, whether located on a lower or upper surface (and thus on opposite sides) of substrate 13, serve to maintain segment 33 in a proper, aligned position relative to the remainder of the substrate.

Flexible substrate 13 further preferably includes a second layer of conductive elements 27' on an opposing surface 25' opposite surface 25 having elements 27. Elements 27' may be of similar configuration to elements 27 and also of similar conductive materials. Additionally, it is also within the scope of the invention that elements 27' are connected to selected ones of elements 27, e.g., using plated-through-hole technology as is known in the art, one representative example illustrated in FIG. 1 by the numeral 35. All of the elements 27 and 27' may be interconnected through such conductive through holes, excluding those designated for bridging the aperture(s) 31. In FIG. 1, at least one conductive element 27' is shown to bridge the lower aperture. In FIG. 2, several such bridging elements 27' are shown, as are several lower bridging conductors 27. The numbers of these bridging elements as shown in the drawings is not limiting of the invention, but provided only for representation purposes. In one embodiment of the invention a total of 60 lower bridging conductive elements 27 may be utilized while a comparative number of 560 such upper bridging conductive elements 27' are used.

Chip 15 includes a plurality of contact sites 41 spacedly positioned along a bottom surface of the chip in accordance with a predetermined pattern. Such contact sites are known in the art and typically provided on semiconductor chips. In one example of the invention, a total of 620 such sites were provided for a chip used in the package structure of the present invention. It is understood that the sites 41 depicted in FIG. 2 are thus provided for representation purposes only and not meant to limit the invention.

In accordance with the teachings herein, selected ones of the lower bridging conductive elements 27 of substrate 13 are thermocompression bonded to selected ones of the contact sites 41 on chip 15. Additionally, the upper bridging elements 27' are similarly attached, both of these attachments occurring, significantly, through the aperture(s) 41 in substrate 13. Of further significance, this relatively harsh means of attachment (thermal compression bonding) is accomplished following attachment of the solder elements (balls) to the lower conductive elements 27, as part of the procedure for making the present invention. This means of solder application is defined in greater detail herein below. Thermocompression bonding represents a known procedure in the microelectronics art and further description is thus not believed necessary.

In FIG. 2 it is seen that each of the bridging elements 27 and 27' is of substantially rectangular configuration and extends across the adjacent aperture(s) 31. Understandably, these are electrically connected to corresponding, respective conductive elements (27 or 27') to form the desired circuits including these elements.

Most significantly, it is seen in comparing FIGS. 1 and 2 that the invention is able to provide means for effectively coupling conductive elements on opposing surfaces of a flexible circuitized substrate to a chip, while also providing effective electrical coupling between these elements and respective conductors on a more rigid, other substrate (e.g., PCB) in such a manner that solder elements are effectively used, including, uniquely, immediately below the chip on a opposite side of the flexible substrate from the chips' position. As seen in FIG. 2, several solder elements 51 may be used immediately below chip 15 on the segment 33 of substrate 13, in addition to several more solder elements 51 at remaining, selected portions of this substrate.

In a preferred embodiment of tile invention, solder elements 51 are initially affixed to selected ones of the lower conductors 27 using a procedure such as defined in detail in the aforementioned U.S. Pat. No. 5,203,075 which patent, as stated, is incorporated herein by reference. Specifically, a solder paste (not shown) is preferably applied to these selected elements 27 and a spherical solder member (ball) is then positioned on the paste. Subsequently, heat is applied to cause the paste to "ball up" and solidify about the solder ball. Two different solders are used, the paste preferably being a 63:37 tin:lead solder, while the individual solder balls are 10:90 tin:lead solder members, these latter elements having a higher melting point than the paste to thus provide the several advantages taught in U.S. Pat. No. 5,203,075.

In another embodiment of the invention, paste may not necessarily be utilized but instead individual spherical solder elements (balls) aligned relative to the respective conductive elements and heat applied to cause partial deformation (melting) of the balls to thereby effect connection to elements 27. Such a process may be similar to that defined in the aforementioned U.S. Pat. No. 5,133,495, which is also incorporated herein by reference.

Figure 3:
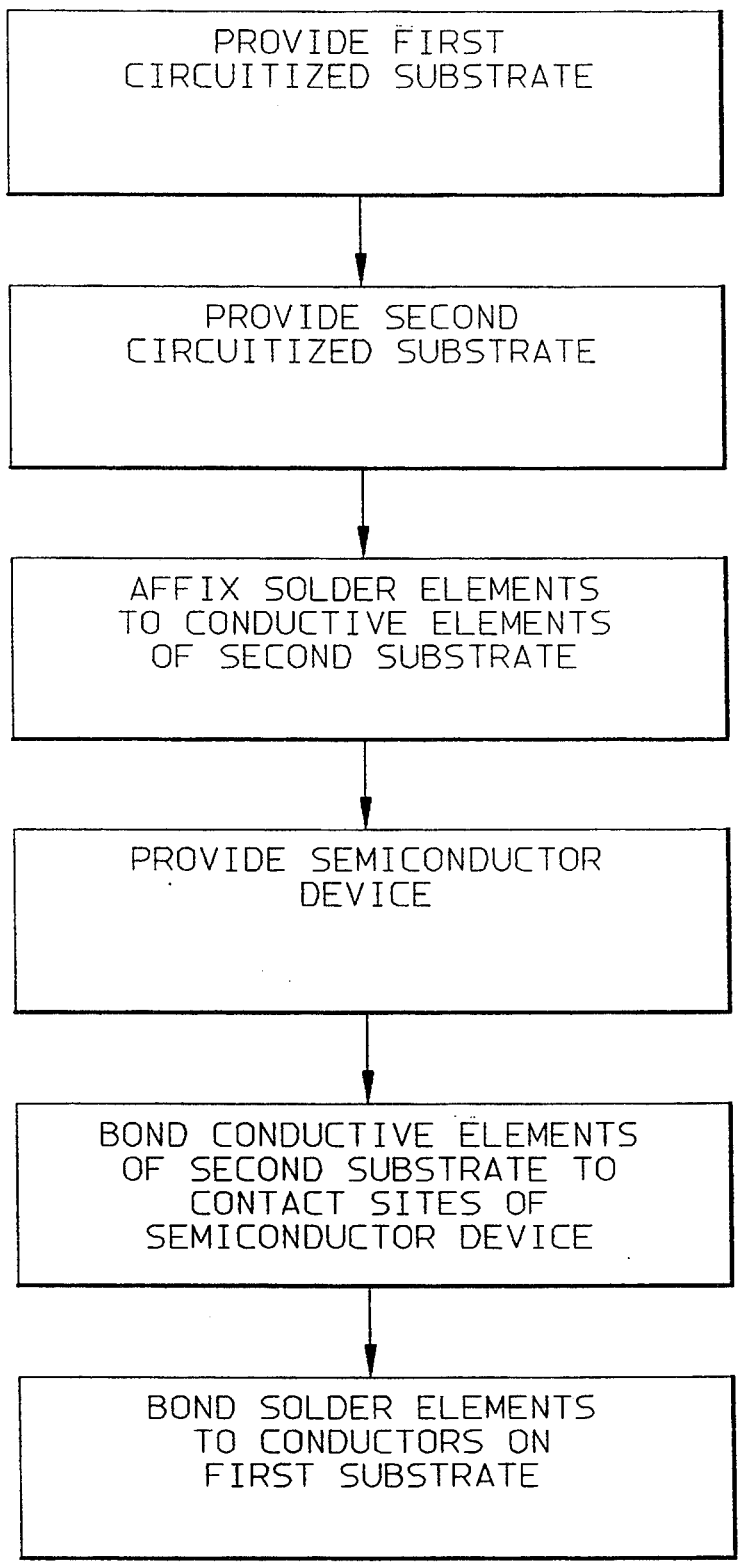
FIG. 3 is a flow diagram representing the various steps of the method of producing an electronic package structure in accordance with a preferred embodiment of the invention.

FIG. 3 represents a flow diagram illustrating the various steps defined above. As understood, a significant feature of the present invention is the initial positioning of solder elements on designated conductive elements of a flexible substrate and thereafter subjecting this substrate, having said solder elements precisely positioned thereon, to a relatively harsh procedure (thermal compression bonding) such that others of such conductive elements will be soundly electrically connected to designated contact sites on a semiconductor device, thus allowing placement of selected ones of the solder elements 51 under (opposite) the semiconductor device as well as along the outer areas of the flexible circuit. Thermal compression bonding, as used herein, involves a single point bonding technique wherein the bonder will extend (project) into the respective apertures 31 to engage elements 27 (or 27') and effect connection with chip 15. Following this procedure, this semiconductor device-flexible circuit subassembly is then aligned, relative to substrate 11 such that the solder elements 51 on substrate 13 are precisely oriented relative to respective conductors (21) on substrate 11. Such alignment is preferably accomplished by using a split optics placement tool commonly used in the industry during surface mount assembly operations. The solder elements 51 of the subassembly are positioned onto respective solder paste sites (the paste not shown in the drawings) in the manner defined in the aforementioned U.S. Pat. No. 5,203,075. Heat is then effectively applied to this aligned structure to cause reflow (melting) of the solder paste so as to effect connection to the respective conductors 21. The solder paste is preferably 63:37 tin:lead and the fellow process accomplished at a temperature of about 200 degrees Celsius (C.).

Thus, there has been shown and described an electronic package and method of making same wherein two technologies (thermal compression bonding and solder attach) are combined to provide a final structure of relatively simple configuration and yet which may be produced in a relatively facile manner. Sound, effective electrical connections of precise nature are provided between respective patterns of contact sites on a semiconductor chip and respective elements and conductors of the two substrates (flex and rigid) which form the final structure. Of equal significance, the above results in a structure of relatively high density (lines per square inch), as is highly desired in the information handling systems field. The product of the present invention is thus adaptable for utilization in many current information handling systems (computer) environments in order to meet the stringent high density requirements thereof. In addition, the method defined herein is capable of being practiced on a relatively large scale (mass production) and thus able to benefit from the several advantages (e.g., cost) thereof.

While there have been shown and described what are at present considered the preferred embodiments of the invention, it will be obvious to those skilled in the art that various changes and modifications may be made therein without departing from the scope of the invention as defined by the appended claims.

What is claimed is:

1. An electronic package comprising:
   a first circuitized substrate including a surface having a plurality of electrical conductors thereon;
   a second circuitized substrate electrically coupled to said first circuitized substrate and including a surface having a first plurality of electrical conductive elements thereon, said second circuitized substrate being flexible and including at least one aperture therein; and
   a semiconductor device having a plurality of contact sites thereon and electrically coupled to said second flexible circuitized substrate along one side of said second substrate, selected ones of said first plurality of electrical conductive elements of said second flexible circuitized substrate bridging said aperture and being electrically coupled to respective, selected ones of said contact sites of said semiconductor device through said aperture, selected ones of said electrical conductive elements being soldered to respective ones of said electrical conductors on said first circuitized substrate, including along a second side of said second substrate, immediately opposite said semiconductor device.

2. The electronic package of claim 1 wherein said first substrate is a printed circuit board.

3. The electronic package of claim 2 wherein said electrical conductors comprise metallic pads.

4. The electronic package of claim 1 wherein said second circuitized substrate includes a second plurality of electrical conductive elements located on a second surface of said substrate opposite said surface having said first plurality of conductors thereon, selected ones of said second plurality of electrical conductive elements being electrically coupled to respective, selected ones of said contact sites of said semiconductor device.

5. The electronic package of claim 4 wherein said selected ones of said second plurality of electrical conductive elements each comprise a lead member which bridges said aperture within said second circuitized substrate.

6. The electronic package of claim I wherein said selected ones of said first plurality of electrical conductive elements each comprise a lead member which bridges said aperture within said second circuitized substrate.

7. A method of making an electronic package, said method comprising:
   providing a first circuitized substrate having a plurality of electrical conductors therein;
   providing a second circuitized substrate including a surface having a first plurality of electrical conductive elements therein and at least one aperture therein, said conductive elements bridging said aperture;
   affixing a plurality of solder elements onto respective ones of said first plurality of electrical conductive elements of said second circuitized substrate;
   providing a semiconductor device having a plurality of contact sites therein;
   bonding selected ones of said first plurality of electrical conductive elements to respective ones of said contact sites of said semiconductor device through said aperture within said second circuitized substrate; and thereafter
   bonding said plurality of solder elements on said respective ones of said first plurality of electrical conductive elements to respective ones of said electrical conductors of said first circuitized substrate.

8. The method of claim 7 wherein said bonding of said selected ones of said first plurality of electrical conductive elements to said respective ones of said contact sites is accomplished using thermal compression bonding.

9. The method of claim 7 where said solder elements are affixed to said selected ones of said first plurality of electrical conductive elements by applying a solder paste to each of said conductive elements, positioning a solder ball onto each of said conductive elements having said paste, and thereafter heating said paste and solder balls.

10. The method of claim 7 wherein said solder elements are affixed to said selected ones of said first plurality of electrical conductive elements by applying a solder ball to each of said conductive elements and thereafter heating said solder balls.

* * * * *